(12) United States Patent
Robbie et al.

(10) Patent No.: US 6,206,065 B1
(45) Date of Patent: Mar. 27, 2001

(54) GLANCING ANGLE DEPOSITION OF THIN FILMS

(75) Inventors: Kevin J. Robbie; Michael J. Brett, both of Edmonton (CA)

(73) Assignees: The Governors of the University of Alberta; Alberta Microelectronic Corporation, both of Edmonton (CA)

(*) Notice: Subject to any disclaimer, the term of this patent is extended or adjusted under 35 U.S.C. 154(b) by 0 days.

(21) Appl. No.: 08/903,295

(22) Filed: Jul. 30, 1997

(51) Int. Cl.[7] ................................... B32B 31/00
(52) U.S. Cl. ............ 156/349; 427/255.7; 427/255.1; 427/255.2; 156/314
(58) Field of Search ................. 118/730, 715, 118/725; 156/611, 610, 150, 151, 314, 349; 427/255.5, 255.7, 255.2, 255.21; 428/325

(56) References Cited

U.S. PATENT DOCUMENTS

| | | | |
|---|---|---|---|
| 3,699,298 | 10/1972 | Briody | 219/10.49 |
| 3,962,988 | 6/1976 | Murayama et al. | 118/49.1 |
| 4,392,451 | 7/1983 | Mickelsen et al. | 118/690 |
| 4,416,217 | 11/1983 | Nakamura et al. | 118/696 |
| 4,496,828 | 1/1985 | Kusmierz et al. | 219/405 |
| 4,579,080 | 4/1986 | Martin et al. | 118/500 |
| 4,947,046 | 8/1990 | Kawabata et al. | 250/484.1 |
| 4,961,399 | 10/1990 | Frijlink | 118/730 |

FOREIGN PATENT DOCUMENTS 0517411   5/1992   (EP) ................... G11B/5/64

OTHER PUBLICATIONS

Copy of the International Search Report in PCT/CA97/00527, 4 pp.
Abstract of Japanese Patent No. 03134819, Jun. 06, 1991, translated, 1 p.
Tang et al, Patterns ans Scaling Properties in a Ballastic Deposition Model, Physical Review Letters, vol. 71, No. 17, Oct. 1993, pp.2769–2772.
Co–pending United States patent application sn. 08/681,434, by applicant Robbie, Kevin J.; Brett, Michael J., titled Shadow Scuplted Thin Films, filed Jul. 23, 1996.

*Primary Examiner*—Merrick Dixon
(74) *Attorney, Agent, or Firm*—Anthony R. Lambert

(57) ABSTRACT

A method of making vapor deposited thin films by rotating a substrate in the presence of an obliquely incident vapor flux. The substrate is rotated about an axis normal to the surface of the substrate while depositing a vapor flux, and then paused while depositing vapor flux to cause columns of a thin film to grow obliquely. The resulting thin film exhibits a porosity that is not dependent on the column angle of the resulting thin films.

18 Claims, 11 Drawing Sheets

$\theta_f = 0°$ $\theta_c = 0°$
LOW POROSITY $\theta_f = 30°$ $\theta_c = 27°$
MEDIUM PORISITY $\theta_f = 80°$ $\theta_c = 55°$
HIGH PORISITY

GLANCING ANGLE DEPOSITION OF THIN FILMS

FIELD OF THE INVENTION

This invention relates to the deposition of shadow sculpted thin films on substrates.

CLAIM TO COPYRIGHT

A portion of the disclosure of this patent document contains material which is subject to copyright protection. The copyright owner has no objection to the facsimile reproduction by anyone of the patent document, as it appears in the Patent and Trademark Office patent file or records, but otherwise reserves all copyright rights whatsoever.

REFERENCE TO MICROFICHE APPENDIX

A microfiche appendix containing software for implementing aspects of the method of the invention disclosed herein forms part of this patent document.

BACKGROUND OF THE INVENTION

In the art of growing thin films, it is known to expose a substrate to an oblique incident vapor flux in conditions of limited adatom diffusion and thus grow a columnar microstructure on the substrate.

The optical properties of the resulting microstructure are dependent in part on the material used, the porosity of the microstructure and the orientation of the columns of the thin film.

Hamaguchi et al, U.S. Pat. No. 4,874,664, describe lateral shifting or rotation of the position of the substrate in relation to the vapor flux to create uniform film growth and film layers that have columns with different orientations in the different layers. In Hamaguchi et al, the entire substrate is rotated in between periods of exposure of the substrate to vapor flux, or the substrate is laterally shifted during exposure to vapor flux.

A paper of Azzam, "Chiral thin solid films", Appl. Phys. Lett. 61 (26) Dec. 28, 1992, has proposed rotation of the substrate while it is exposed to the oblique incident vapor flux to generate a helical microstructure having helicoidal bianisotropic properties. The proposed rotation of the substrate is about an axis perpendicular to the surface of the substrate, which is referred to in this patent document as rotation about the azimuth, or variation of the azimuthal angle.

The inventors have proposed improvements to the methods of Azzam and Hamaguchi, as described in "First thin film realization of a helicoidal bianisotropic medium", Kevin Robbie and Michael J. Brett, Akhlesh Lakhtakia, J. Vac. Sci. Technol. A 18(6), Nov/Dec 1995, p. 2991–2993.

In these references, the relationship of porosity to column angle is fixed, and there has been no way to vary porosity while maintaining the column angle fixed. The present invention seeks to overcome this limitation in the earlier references.

SUMMARY OF THE INVENTION

There is thus proposed, according to an aspect of the invention, a method of growing vapor deposited thin films, the method comprising the steps of:

A) initially exposing a surface of a substrate to a vapor flux under a given set of growth conditions at an oblique incident angle while rotating the direction of arrival of the vapor flux at the substrate at a rotation speed about a normal to the substrate to grow a first portion of a thin film formed of a plurality of columns growing in a first growth direction;

B) subsequently, and while exposing the surface to vapor flux, altering the set of growth conditions, namely the rotation speed of the direction of arrival of the vapor flux at of the substrate, to cause a second portion of each of the plurality of columns to grow in a growth direction offset from the first growth direction; and C) repeating steps A and B to create a first thin film formed of columns on the substrate.

During step A, the substrate may be rotated an integral number of times, or, to create a helical pattern, rotated nearly an integral a number of times and paused between periods of rotation at sequentially offset positions.

An optical filter may thus be made with plural thin film layers, wherein each thin film layer is formed by repeating steps A and B.

Preferably, the rotation speed of the direction of arrival of the vapor flux at the substrate during step A is sufficiently high that the direction of arrival of the vapor flux at the substrate rotates at least once within the time required for the thin film to grow a distance, measured normal to the substrate, substantially equal to the adatom diffusion length of the material being deposited.

According to a further aspect of the invention, there is provided a microstructure comprising a first thin film of plural columns extending from a surface of a substrate, wherein the columns are formed under a given set of conditions by vapor deposition on the surface of the substrate from vapor flux incident at an angle $\theta_f$ to a normal to the surface of the substrate, where $0°<\theta_f<90°$, the vapor being deposited at least in part while the direction of arrival of the vapor flux at the substrate is rotating, and the columns exhibit the property that $0°<\theta_c<\theta_n$ where $\theta_c$ is the angle between the columns and a normal to the surface of the substrate and $\theta_n$ is the angle at which the columns would grow under the given set of conditions without rotation of the direction of arrival of the vapor flux at the substrate.

Preferably, the columns are formed at least in part while the direction of arrival of the vapor flux at the substrate is rotating at a rotation speed that is sufficiently high that the direction of arrival of the vapor flux at the substrate rotates at least once within the time required for the thin film to grow a distance, measured normal to the substrate, substantially equal to the adatom diffusion length of the material being deposited.

A second thin film may be formed on top of the first thin film with a different porosity, which may be created by deposition of the second thin film with a different incident angle of vapor flux than the incident angle $\theta_f$ for the first thin film. The plural thin films may form a continuous stack of thin film layers, one of the plural thin film layers being placed against the top of the first thin film, with each thin film layer having a different porosity from adjacent thin film layers. The thin film may have an refractive index that varies with distance from the substrate.

There is also provided a method of growing vapor deposited thin films, the method comprising the steps of:

exposing a surface of a substrate to a vapor flux at an oblique incident angle while rotating the direction of arrival of the vapor flux at the substrate at a rotation speed about a normal to the substrate to grow a thin film formed of a plurality of columns growing in a first growth direction; and the rotation speed being sufficiently high that the the direction of arrival of the vapor flux at substrate rotates at least once within the time required for the thin film to grow a distance, measured normal to the substrate, substantially equal to the adatom diffusion length of the material being deposited.

According to a further aspect of the invention, there is provided the step of, while rotating the direction of arrival of the vapor flux at the substrate, varying the oblique incident angle of the vapor flux to vary the density and hence refractive index of the thin film.

According to a further aspect of the invention, the oblique incident angle of vapor flux is varied to produce alternating bands of high and low density material deposited on the substrate.

According to a further aspect of the invention, there is provided a method of filtering electromagnetic radiation, wherein the electromagnetic radiation includes radiation having a frequency λ and the electromagnetic radiation is propagating along a light path, the method comprising the steps of:

placing an optical filter in the light path, wherein the optical filter comprises plural helical columns extending from a substrate, the helical columns each having a pitch p sufficiently smaller than λ (for example, p<λ/4, or p<λ/10) that propagation of light is unaffected by the helical structure of the columns.

These and other aspects of the invention are described in the detailed description of the invention and claimed in the claims that follow.

BRIEF DESCRIPTION OF THE DRAWINGS

There will now be described preferred embodiments of the invention, with reference to the drawings, by way of illustration, in which like numerals denote like elements and in which.

DETAILED DESCRIPTION OF PREFERRED EMBODIMENTS

"Oblique" as used in this patent document in relation to an angle means sufficiently departing from 0° that atomic shadowing has a significant effect on the growth of columnar microstructures. In the case of a rapidly rotating substrate, for low angles of incidence of vapor flux, for example at 0–50°, the resultant thin films do not have particularly useful properties. However, the inventors have found that for angles of incidence of vapor flux greater than 70° and even more so at 80° and greater, the resultant thin films have well defined structures with useful properties. The direction of arrival of an obliquely incident vapor flux at a substrate is the direction in the plane of the substrate obtained by a projection, normal to the substrate, of the angle of incidence onto the substrate. Rotation of the direction of arrival of the vapor flux at the substrate is obtained typically, and most easily, by rotation of the substrate, whereby the direction of arrival of the vapor flux at the substrates rotates around a normal to the substrate. Hence, the invention will be described, in the illustrative embodiment for the case when the substrate itself rotates.

The substrate may be any solid material on which a vapor may be deposited, and will depend on the application. Silicon and glass substrates will be commonly used. The material to be deposited may be any material for which conditions are achievable to support vapor generation and deposition of the vaporized material on the substrate. In some cases, this may require cooling or heating of the substrate. To assist in bonding one vaporized material to another, an intervening layer may be first deposited, as for example using a chromium intermediate layer to bond gold to amorphous silicon dioxide (glass). The processes described here should be carried out in conditions in which the vapor flux arrives at the substrate in approximately a straight line. For this reason, it is preferred that the process be carried out under conditions approximating a vacuum, at less than $10^{-3}$ torr, for example at $10^{-6}$ torr. At higher pressures, scattering from gas molecules tends to prevent well defined structures from growing. In addition, the material used should have a sticking co-efficient of at least about 0.9 to enable the formation of distinct structures. The growth direction of a column of material is along the axis of the column away from the substrate from which the column is growing. In the case of a helical column, in which the helical structure follows the surface of a hypothetical cylinder, the axis of the column is the axis of the cylinder.

Figure 1A:
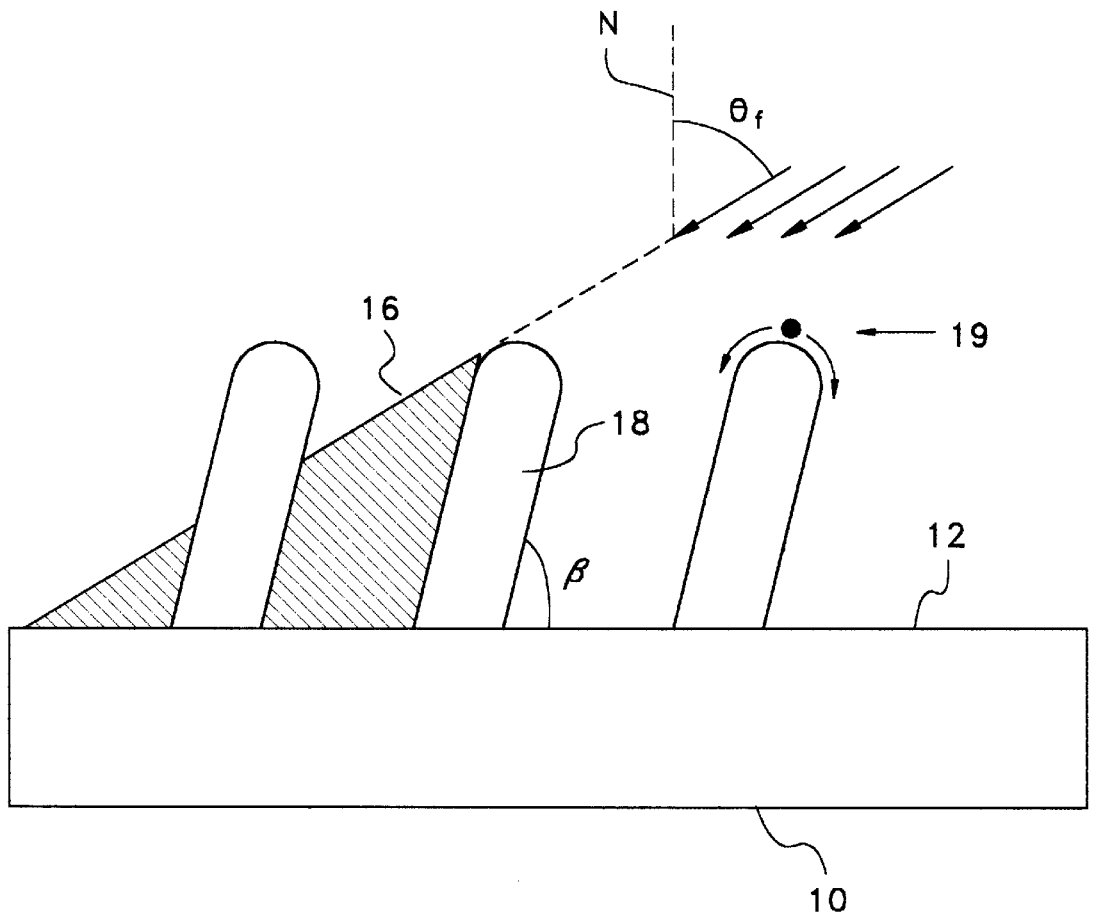
FIG. 1A is a schematic illustrating prior art understanding of how shadow sculpting forms columnar film microstructures.

FIG. 1A illustrates the physical process underlying growth of a slanted columnar film microstructure as is known in the prior art. A substrate 10, for example a silicon wafer, has a surface 12 with normal N and is exposed to an oblique incident vapor flux 14 whose angle of incidence, defined in relation to the normal N, is $\theta_f$. As atoms in the vapor flux 14 are deposited onto the substrate 10, film growth areas atoms shadow adjacent regions 16, preventing deposition of vapor in these regions. Atoms in the vapor flux 14 continue to be deposited in regions that are not shadowed, thus forming columns 18. Adatoms diffuse atomically across the tops of the columns as shown at 19. Slanted columnar microstructures will grow if the angle $\theta_f$ is sufficiently large to create the shadowing effect, and there is limited adatom diffusion 19, such that adatom diffusion does not fill in the gaps between columns.

The growth conditions under which a columnar thin film grows on a substrate include the substrate temperature (typically from about 77° K. to 600° K.), pressure of the vessel in which the vapor deposition takes place, vapor flux intensity (which depends upon the proximity of the vapor source to the substrate and the evaporation rate), vapor flux energy (which depends on the manner in which the vapor flux is created, for example by sputtering or heating), type of material used to produce the vapor flux, for example Cu, $MgF_2$, $CaF_2$, SiO, Al, Mn, Cr, Ag, Si, Co, $ZrO_2$, Ti and Permalloy™ (85% nickel, 15% iron alloy), rotation speed of the substrate, angle of incidence of the vapor flux and the nature of the background gas in the vessel, which is typically maintained at a very low pressure. In general, if no reaction with the background gas is desired, very low pressures are preferred, in which case air may be used as the background gas in most cases. If reaction of the vapor with the background gas is desired, for example in the deposition of $SiO_2$ instead of $SiO_{1.4}$, then a background gas comprising $O_2$ at low pressure is desirable.

Figure 1B:
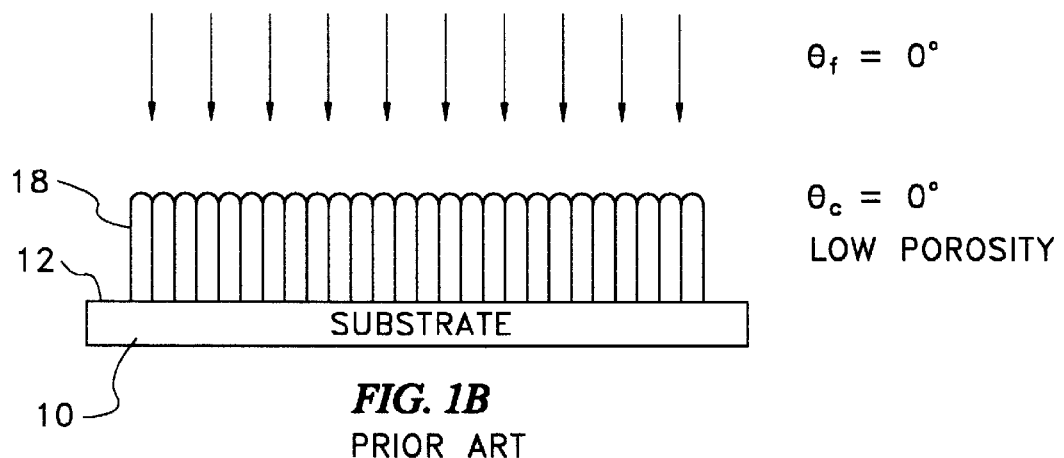
FIGS. 1B–1D show how variation of the flux angle in the prior art may be used to vary column angle and porosity.
Figure 1C:
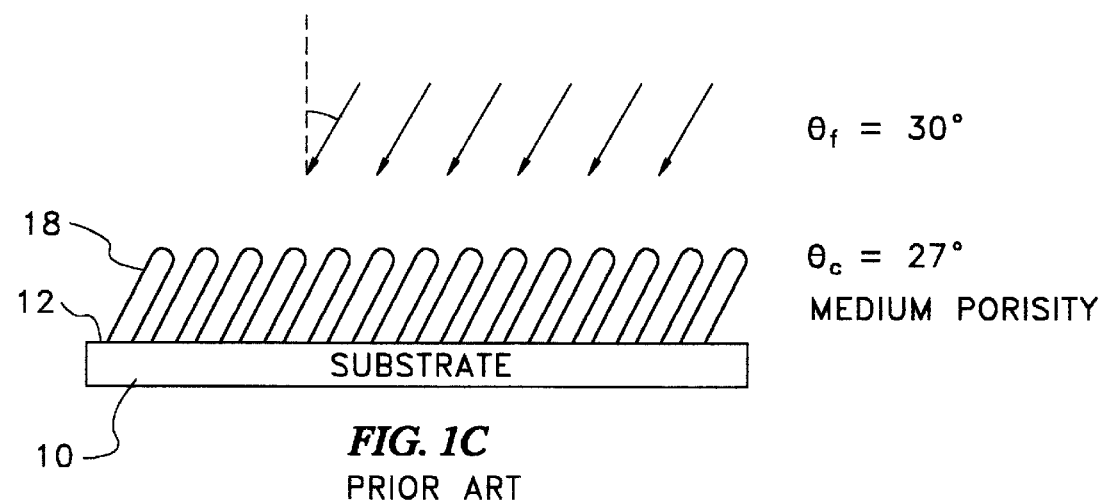
Figure 1D:
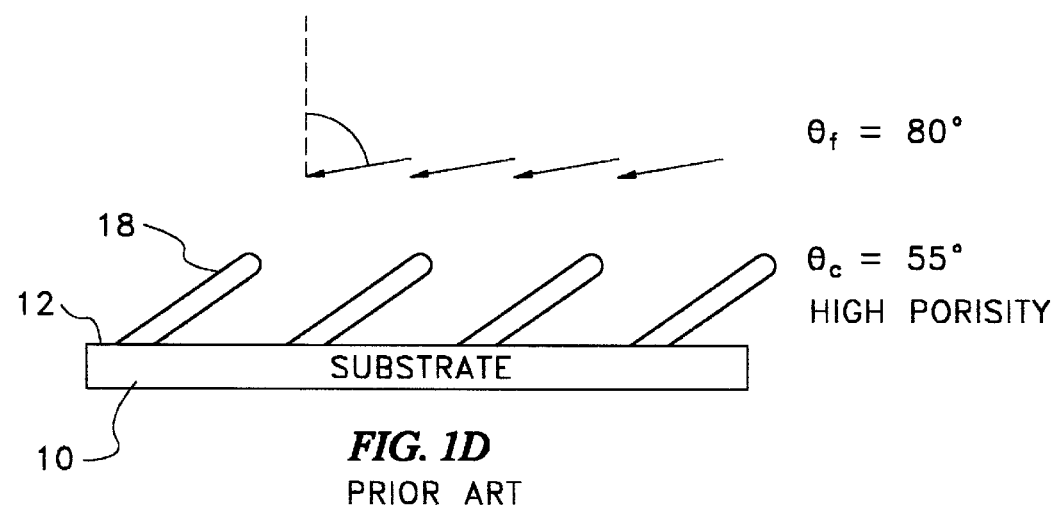

In thin film deposition as known in the prior art, there is a fixed relationship between the angle $\theta_f$ that the vapor flux arrives at the substrate and the angle $\theta_c$ (90–β, where β is shown in FIG. 1A) to the substrate normal at which the columnar thin film grows (for a given material and set of deposition conditions). This constraint creates a situation where the columnar orientation and the porosity cannot be controlled independently. If a shallow columnar angle (more parallel to the substrate) is desired, the resulting film must be very porous. Conversely, if a vertical columnar film is desired, the film must be dense. This effect is illustrated in FIGS. 1B–1D. FIG. 1B shows the situation when the vapor flux arrives straight down onto the substrate $\theta_f=0°$. The resulting film is very dense with a vertical $\theta_c=0°$.

When the flux does not arrive parallel to the substrate normal ($\theta_f>0°$), the columnar film growth is inclined toward the vapor source. The relationship between the flux angle $\theta_f$ and the column angle $\theta_c$ is complex, depending on film material, substrate temperature, and other deposition conditions. A simple relationship which provides rough estimates of the column angle from a known flux angle was proposed by Tait et al [Thin Solid Films, 226(1993)]. This relationship may be used as an approximation to describe the column angles for different flux angle conditions. FIG. 1C shows the case where the flux arrives at $\theta_f=30°$. The column angle is $\theta_c=27°$ (as calculated with Tait's rule) and the film is somewhat porous. FIG. 1D shows the extreme case where the flux arrives at a highly oblique angle $\theta_f=80°$. The columnar angle is now $\theta_c=55°$ and the film is very porous.

Figure 2:
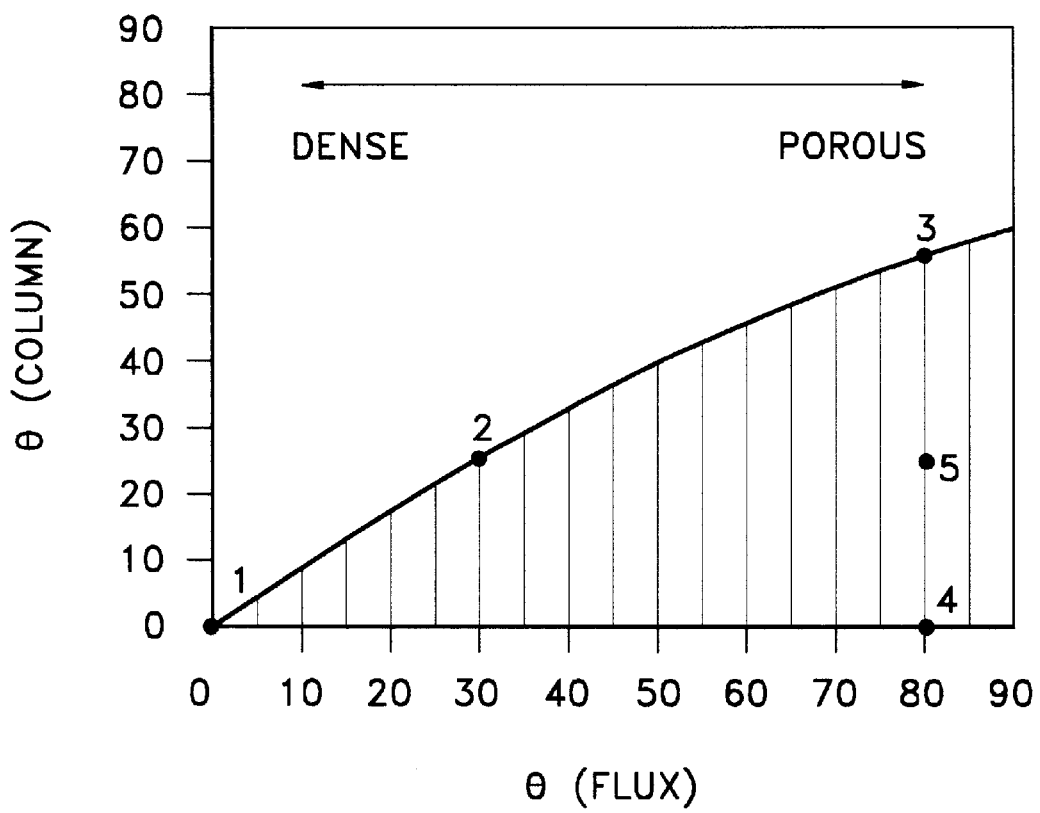
FIG. 2 is a graph showing variation of column angle with flux angle of incidence.

These three results of film structure with incident flux angle are summarized in FIG. 2 where the columnar growth angle is graphed against the vapor flux arrival angle. The solid line is calculated from Tait's rule. Point 1 corresponds to the film shown in FIG. 1B ($\theta_f=0°$ and $\theta_c=0°$). Points 2 and 3 correspond to FIG. 1C and 1D respectively. Conventionally, film microstructures are confined to points on this line. For a chosen flux angle, the column angle and porosity are fixed (for a given material and set of deposition conditions).

Figure 3:
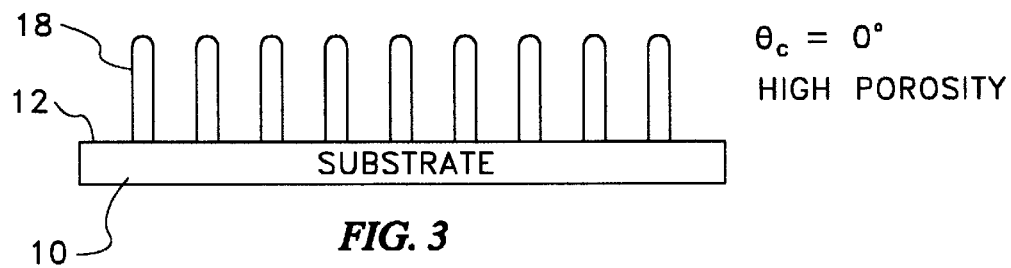
FIG. 3 shows schematically a columnar thin film that could not be created conventionally.

For example, a highly porous film with a vertical columnar structure cannot be produced according to the known prior art. This condition would correspond to point 4 in FIG. 2, and the microstructure is shown in FIG. 3.

Figure 4:
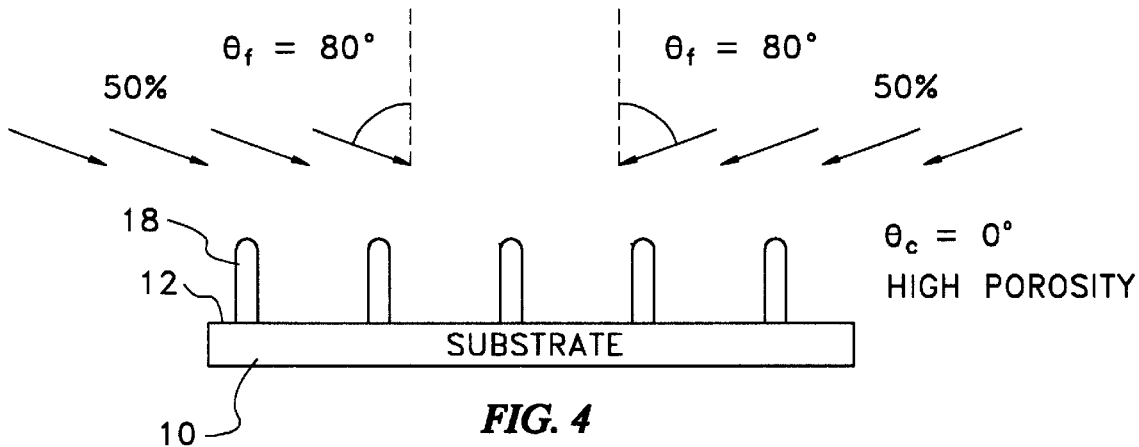
FIGS. 4 and 5 show a side view of a columnar thin film illustrating how bidirectional flux incidence may be used to overcome the limitation in the prior art illustrated in FIG. 3.

This invention describes an improved version of glancing angle deposition (GLAD) which provides a method to circumvent this limitation. While the new technique is based on three-dimensional substrate motion, it is useful for illustration to first describe how a similar effect may be achieved in two dimensions. FIG. 4 shows a method which will allow fabrication of the microstructure shown in FIG. 3 which is believed to be impossible conventionally. With substantially equal amounts of vapor flux arriving onto the substrate from two sides at an oblique angle ($\theta_f=80°$), a porous yet vertical columnar film can be produced. The balanced flux (50%/50%) eliminates the tendency for the columns to be inclined toward the vapor source and the oblique angle produces a porous microstructure.

Figure 5:
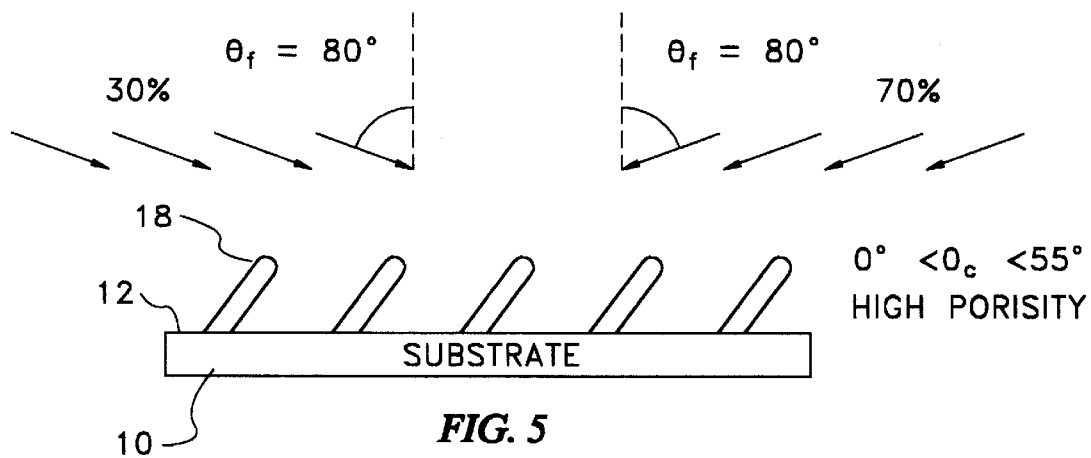

The growth of this film can be thought of as resulting from the sum of the growth caused by the vapor flux from one side and the growth caused by the flux from the other side. To produce a vertical columnar structure, the quantity of the flux from each side is chosen to be substantially equal (50% of the total from each side). Alternately, as seen in FIG. 1D, 100% flux from one side gives a highly inclined structure with $\theta_c\sim55°$ for $\theta_f=80°$. To obtain a column angle between vertical and 55°, the amount of flux from one side is chosen to be between 50% and 100%. FIG. 5 shows this result. With 70% of the flux from one side and 30% of the flux from the other, the column angle is more vertical than with the one sided flux case (100% from one side—FIG. 1D), but not totally vertical (50%/50% case—FIG. 4). With conventional GLAD, film porosity depends on incident flux angle, as does column growth angle, leading to interdependence of these two properties. With the new invention, film porosity still depends on incident flux angle, but column growth angle is now controlled by varying the proportion of flux arriving from each side.

Figure 6:
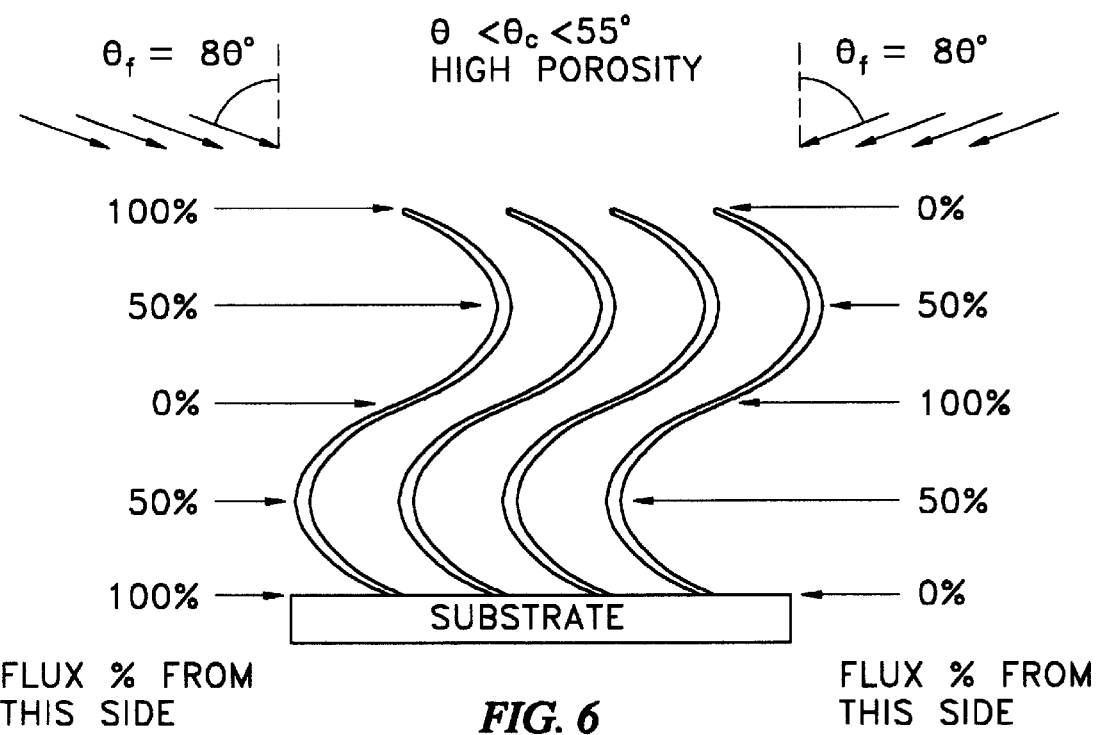
FIG. 6 shows a columnar film that may be made following the principles of the invention.

This can be extended by dynamically varying the flux percentages during deposition to achieve much more control over thin film structure than was previously possible. An example of a structure which can be obtained with this procedure is shown in FIG. 6. The amount of flux arriving from the two sides is varied between 0% and 100% as the film grows to produce the desired microstructure. This technique allows the density to remain constant throughout while controlling the columnar angle independently.

An alternate method of forming 'S' shaped columnar structure would be to vary the incident flux angle $\theta_f$ between oblique ($\theta=80°$) and normal ($\theta_f=0°$). This would change the column growth angle between $\theta_c=55°$ and $\theta_c=0°$ but because of the dependence of porosity on incident angle, the film density would vary between high density when $\theta_f=0°$ and low density when $\theta_f=80°$.

To extend this technique to deposition in three dimensions, the types of growth must be conceived somewhat differently. Vertical columnar growth of one portion of a thin film is produced by rotating the substrate at a sufficiently high speed that the helical structure normally created during glancing angle deposition of thin films with substrate rotation is functionally eliminated. Complete elimination of the helix may be obtained if the substrate rotates once within the time required for the thin film to grow a distance, measured normal to the substrate, substantially equal to the adatom diffusion length of the material being deposited. The adatom diffusion length may be approximated by the width of a strand of a helix that may be formed during slow or no rotation. Functional elimination of the helix pattern may be obtained at slower rotation speeds if the remaining small helical structure is not detrimental to a specific application. Exemplary diffusion lengths for unheated substrates are: $MgF_2$-60 nm; Cu-150 nm, Cr-90 nm, Mn-80 nm and Al-100 nm. Substrate rotation at a speed sufficient to functionally eliminate the inherent helical structure may be called spinning growth.

As an example of when the helical structure of the columns is functionally eliminated consider the case of filtering electromagnetic radiation, wherein the electromagnetic radiation includes radiation having a frequency λ and the electromagnetic radiation is propagating along a light path. An optical filter may be placed in the light path, in which the optical filter has plural helical columns extending from a substrate. The effect of the columns is functionally eliminated if the helical columns each have a pitch p sufficiently smaller than λ that propagation of light is unaffected by the helical structure of the columns. At the same time, the helical columns may have a larger helical geometry or may be arranged with a varying index of refraction that the optical filter has other useful properties that is not dependent on the small scale helical geometry of the columns. In general, the small scale helical columns will not affect light propagation when $p<\lambda/4$, particularly when $p<\lambda/10$.

Spinning growth effectively provides a flux distribution that is substantially equal from all directions around the substrate while the polar angle $\theta_f$ remains fixed—analogous to FIG. 4 and the columns grow in a growth direction that is perpendicular to the surface of the substrate. Inclined growth in a growth direction offset from the vertical is produced by altering one of the growing conditions, namely reducing the substrate rotation speed so that the substrate is effectively held in place and not rotating (call this paused growth—analogous to FIG. 1D). Minor deviations from exactly zero rotation speed are permissible, providing the overall effect is to produce an offset growth direction (that is, the growth direction is not the same as during the preceding deposition period). The column then begins to grow conventionally slanted towards the vapor source, though at a steeper angle than $\theta_f$. Thus a second portion of the thin film is formed which has a different growth direction than the growth direction in which the portion of the column grows during spinning growth. Repetition of spinning growth and paused growth causes the column to grow with an angle $\theta_c$ that is less than $\theta_n$, the angle at which the columns would grow under the same growing conditions without rotation of the substrate.

Figure 7:
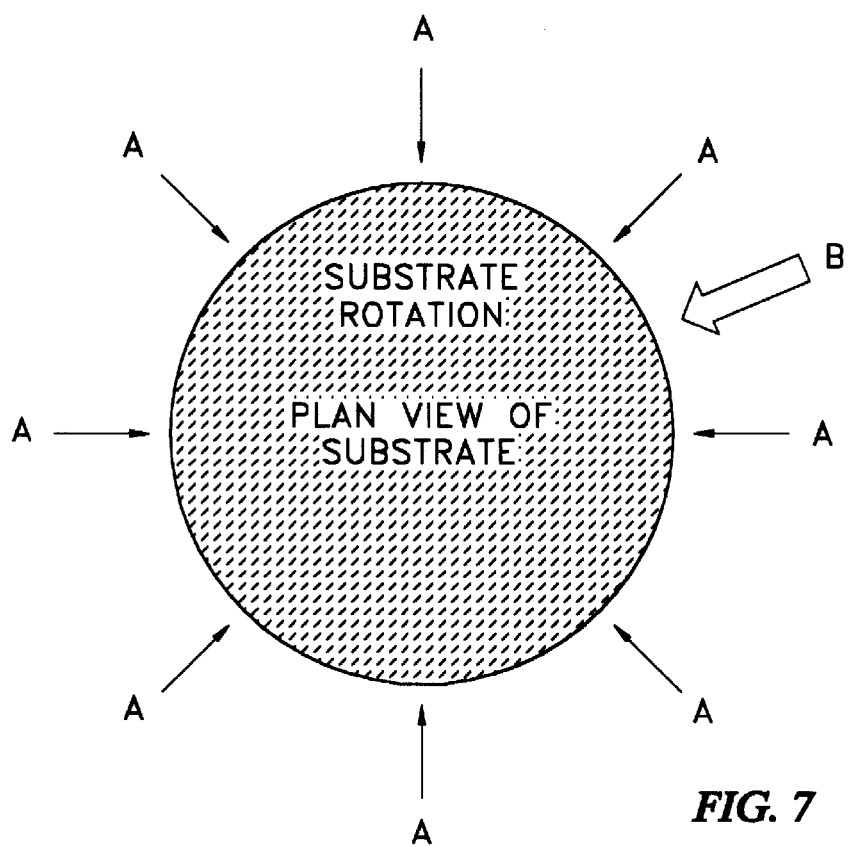
FIG. 7 is a plan view of a rotating substrate illustrating operation of one aspect of the invention.

Spinning and paused growth conditions are illustrated with the plan view of the substrate in FIG. 7. The small single arrows A depict the flux arriving from all directions while the substrate is spinning quickly (spinning growth). The double arrow B depicts the second type of growth where the substrate is fixed and a columnar structure inclined toward the vapor source is produced (paused growth). These two types of motion/growth (spinning and paused) are combined to achieve control over the microstructure of the fabricated thin films just as the amount of flux from two sides was used in the two dimensional description above. The way that the combination of these deposition methods is accomplished is by rotating the substrate quickly to produce the spinning growth, but pausing during each revolution to produce the paused growth. Control over the structure comes from choosing how long to pause relative to the time for one revolution and from choosing the pause position. As in the two dimensional example, the type of deposition can be described by the percentage of the flux that arrives during the paused and spinning growth conditions. The substrate is typically rotated an integral number of times, for example, once.

For three dimensional deposition, 100% spinning growth with $\theta_f$ held at 80° will produce a film with a structure similar to FIG. 4. The spinning growth produces vertical columns and the oblique deposition ($\theta_f$=80°) produces a porous structure. For a deposition with 30% spinning growth and 70% paused growth with the pause position in the same place azimuthally for each pause, a structure similar to FIG. 5 will be produced. The percentages of each of spinning and paused growth can vary between 0% and 100%. Great power of this technique arises when the pause position is not kept the same after each revolution of spinning growth, but is made to precess in a desired way. In this instance, the pause position is slightly azimuthally offset from the previous pause position. The degree of offset affects the radius of the resulting helical structure. A common structure produced with conventional GLAD is a helical columnar film. Before this invention, helical structure was confined by the relationship discussed earlier between deposition angle and columnar angle. If a porous film with helical structure is desired, it must be deposited at an oblique angle ($\theta_f$=80° for example,. Conventionally this would mean that the columnar angle would be about $\theta_c$=55° and the column shape would be similar to the outer helix 41 of FIG. 3. The inner helix 43 could not be produced in a porous film. To produce more vertical column angles in the helix would require less oblique flux angles ($\theta_f$=30° for example) and this would result in a denser film.

Figure 8:
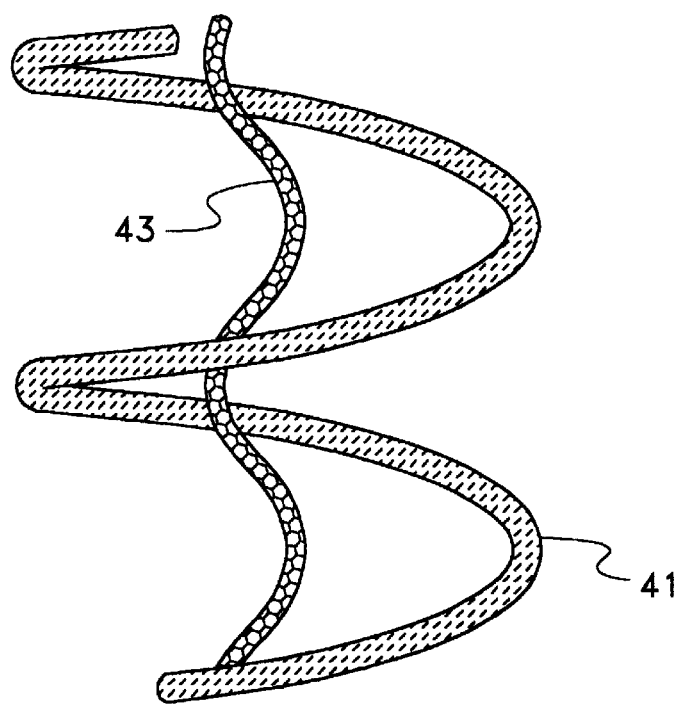
FIG. 8 is a perspective showing a novel helix (inner helix) that may be formed according to the invention.

The realization of this advanced control method has been demonstrated by the inventors. A thin film of $MgF_2$ was deposited at an oblique angle ($\theta_f$=85°). The film was deposited with the advanced precessing technique with spinning growth (with a pitch of 100 nm forming larger helical columns) used for 50% of the deposition time and precessing paused growth (with a pitch of about 1 μm) used for 50% of the deposition time. As predicted, a much more vertical rise angle is obtained ($\theta_c$≡15°) and this structure is similar to the inner helix of FIG. 8. This is a structure which could not be obtained with conventional GLAD and demonstrates the ability of the precessional method for controlling thin film microstructures.

Figure 9:
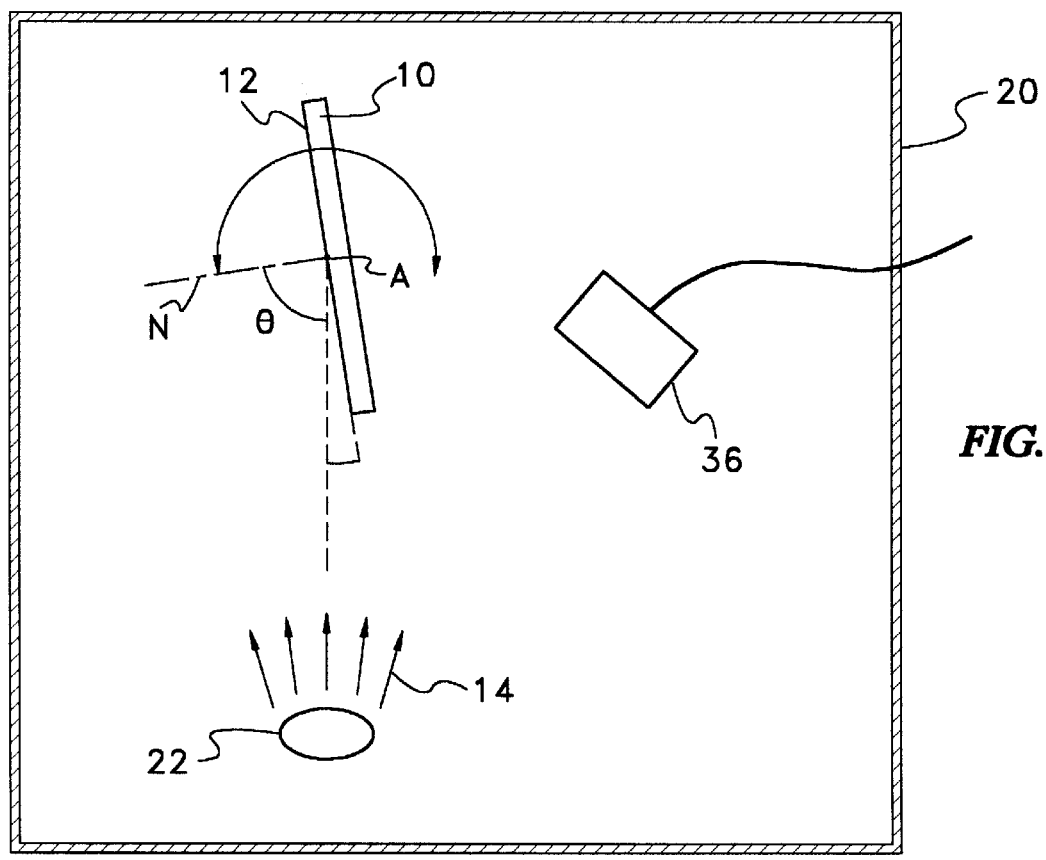
FIG. 9 is a schematic showing apparatus according to one aspect of the invention for depositing a thin film on a substrate using a vapor flux, with an exemplary substrate shown in side view, thereby illustrating how polar angle variation alters the incidence of the vapor flux.
Figure 10:
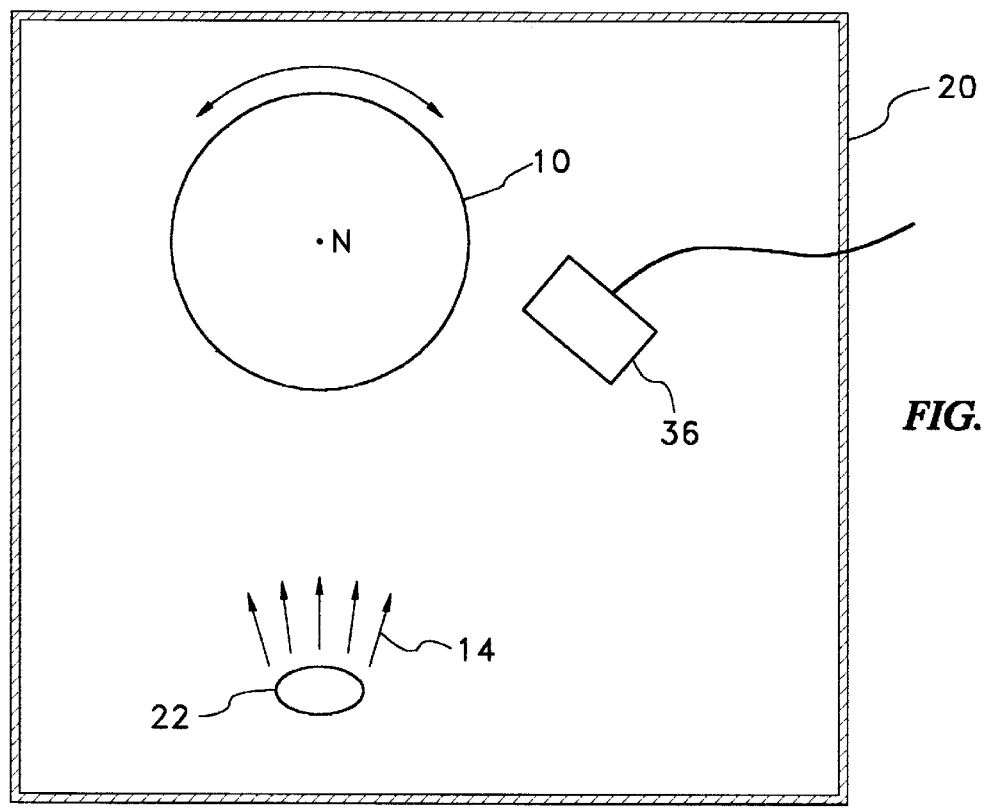
FIG. 10 shows the apparatus of FIG. 9 with the substrate in plan view, thereby illustrating rotation of the substrate about a normal to the plane of the substrate.
Figure 11:
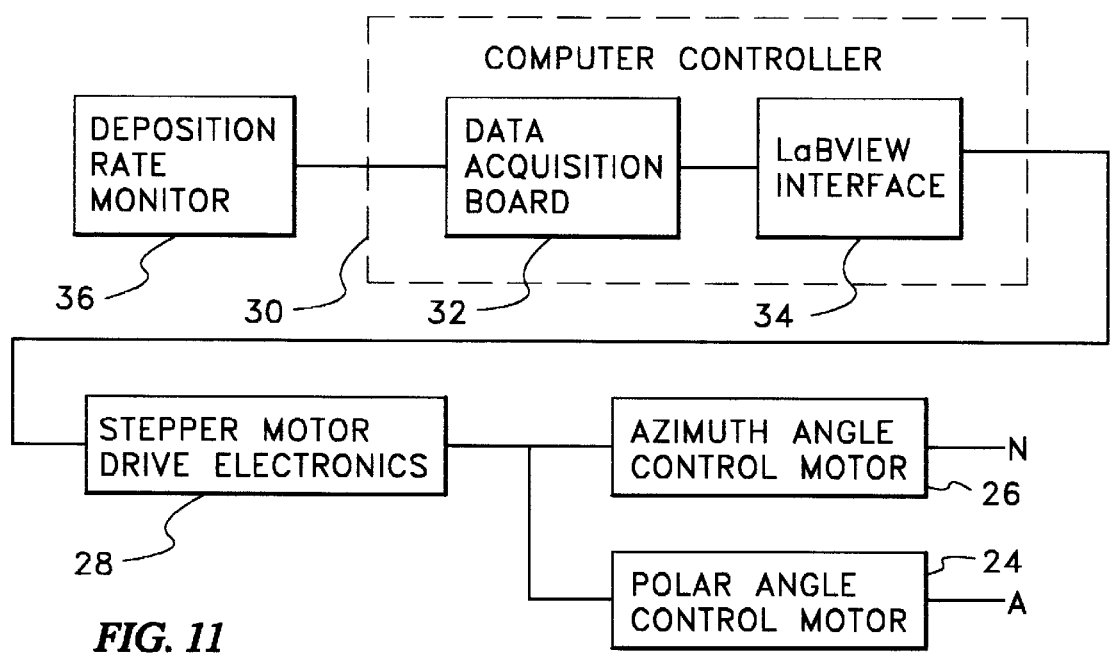
FIG. 11 shows control elements for use with the apparatus of FIGS. 9 and 10.

Referring now to FIGS. 9, 10 and 11, an apparatus according to the invention is shown for growing a thin film on a substrate 10 having a surface 12. A conventional vapor source 22 is located within a vacuum chamber 20. A conventional shutter (not shown) located above the vapor source 22 is used to control whether or not the substrate 10 is exposed to vapor. Various conventional means (not shown separately) for causing the vapor source 22 to emit a vapor flux 14 may be used. A substrate 10 is supported in the vacuum chamber 20 on a motor 24 (FIG. 11) disposed in the vacuum chamber 20 above the vapor source 22. The motor 24 rotates the substrate about an axis A lying parallel to and preferably in the plane defined by the surface 12 of the substrate 10. Rotation of the substrate 10 about axis A alters the polar angle, namely the angle of incidence θ of the vapor flux 14. Motor 26, also disposed in the vacuum chamber 20 above the vapor source 22, has a rotational axis coinciding with the normal N of the substrate 10 and thus alters the azimuthal angle. The polar angle and the azimuthal angles are both measures of the orientation of the surface of the substrate to the incident flux.

Figure 11A:
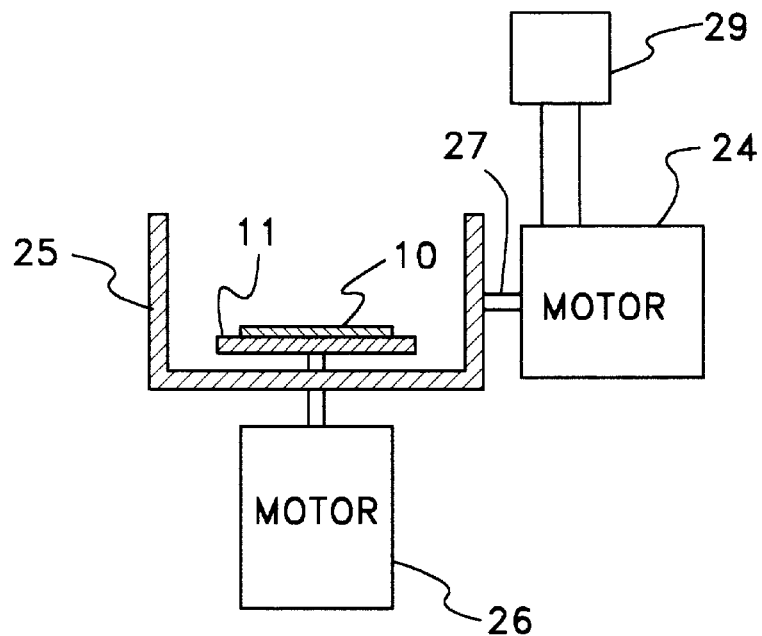
FIG. 11A shows an arrangement of the azimuthal and polar angle control motors.

As shown in FIG. 11A, the substrate 10 is preferably mounted on a disc 11 which is attached to motor 26. Various mounting arrangements of motor 24 and motor 26 may be used. For example, motor 26 may be mounted on a frame 25, and the frame 25 may be mounted to rotate with the drive shaft 27 of motor 24. Motor 24 itself may be mounted by any of various conventional methods for mounting motors within a vacuum chamber such as on a support 29.

Referring now to FIG. 11, motors 24 and 26 are preferably conventional stepper motors driven by stepper motor drive electronics 28 and controlled by computer controller 3C. The computer controller 30 includes a data acquisition board 32 and a software based interface 34 such as LabVIEW™ available from National Instruments. The data acquisition board 32 receives signals indicative of thin film growth on the substrate output from a deposition rate monitor 36 of conventional construction located within the vacuum chamber 20 in a location in which film growth on the deposition rate monitor 36 is representative of film growth on the substrate 10. In response to receiving the output signals from the deposition rate monitor 36, the computer controller 30 instructs the driver 28 to cause the motors 24 and 26 to rotate according to a desired pattern. As described herein, the computer automatically controls the rate of change of the orientation of the surface in response to the output control signals to grow the thin film according to the desired pattern. An exemplary software program for programming the computer controller 30 using LabVIEW™ software is contained in the appendix. Start and stop signals for vapor deposition may be sent by the computer to a drive for the shutter for starting vapor deposition, or the shutter may be opened manually. Normally, the motors are started before the shutter opens to initiate deposition.

The software receives a deposition rate from the deposition rate monitor. The actual thickness (T2) of the film growing on the substrate is related to the thickness on the deposition rate monitor by an empirically determined scaling factor known as the tooling factor. The software also knows the motor positions at the last time instant (Xfi for motor 24, Xci for motor 26) and receives as input from the operator, the number (N) of turns to be made by the motor 26, the tooling factor (ratio of vertical film growth rate to measured deposition rate), an initial deposition rate estimate, an initial angle of incidence for the vapor flux during sculpted film growth, motor rotation direction, and various parameters that define the desired pattern of growth for the film. The inputs to the computer establish the desired pattern of film growth.

In an embodiment of the invention, the motors 24, 26 are step motors that rotate a fraction of a circle each time instant, ti, ti+1, ti+2 etc. At any given time ti, the computer has just updated the thickness of the film from the deposition rate monitor 36 and changed the motor step rate so that at ti+1, the motor 24, 26 will be at approximately the desired position according to the desired pattern. Between time instants ti and ti+1, the software calculates what the thickness of the film growth will be at ti+2 and calculates how fast the motors must rotate in order to give the desired thickness at ti+2. At ti+2, the computer then reads the new thickness from the deposition rate monitor as well as the motor stepping rates, and adjusts the motor stepping rate so that at ti+3 the film growth pattern will be approximately as desired. The software continues in this fashion until a stop signal is received, for example when the film has reached a desired thickness.

Figure 7A:
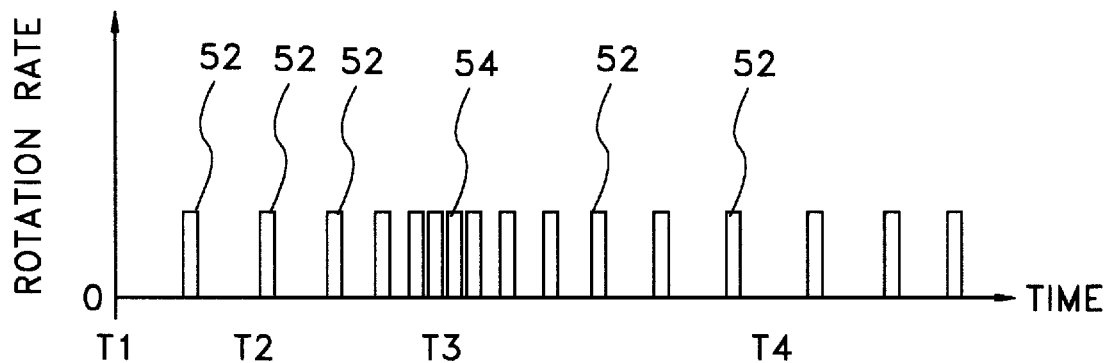
FIG. 7A is a graph illustrating variation of time interval between periods of rapid rotation of a substrate about its azimuthal axis, with intervening pausing of substrate rotation.
Figure 7B:
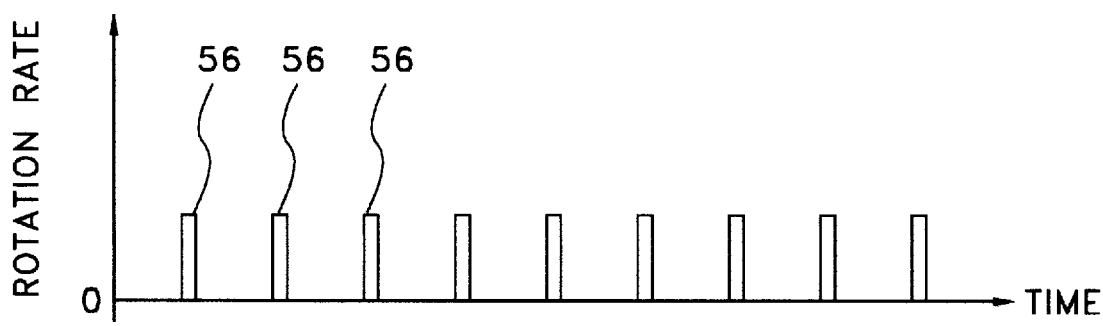
FIG. 7B is a graph illustrating repeated rapid spinning and paused motion of a substrate.
Figure 7C:
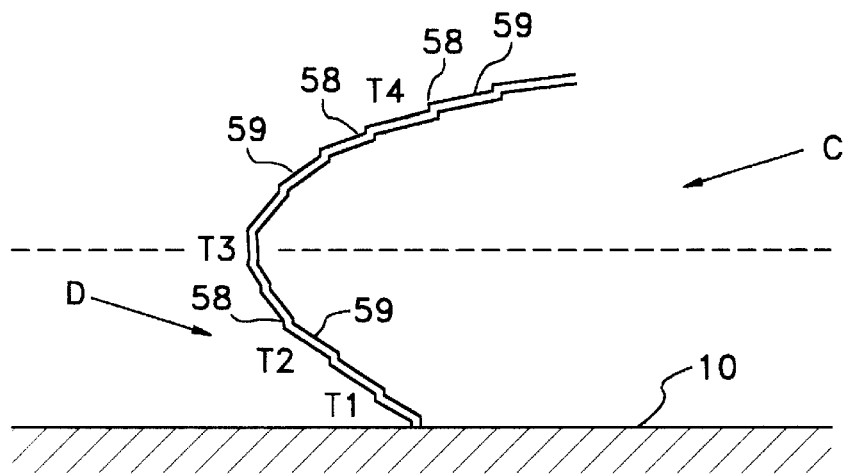
FIG. 7C shows detail of a column of a thin film formed using the substrate rotation illustrated in FIG. 7A.
Figure 7D:
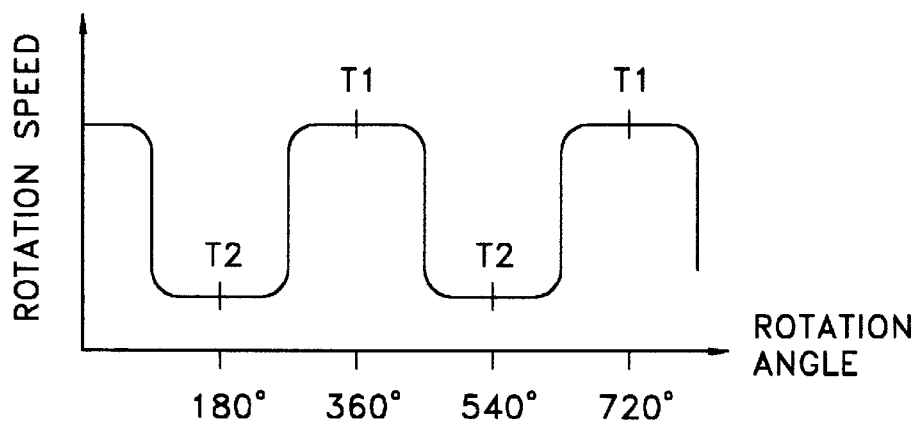
FIG. 7D is a graph showing rotation of a substrate with periodically faster and slower rotation speeds.

Algorithms for controlling the motors 24, 26 in the case of spinning and paused growth are incorporated in the appendix, and illustrated graphically in FIGS. 7A–7B and 7D. Rotation speed of the substrate about its normal depends in part on the deposition rate. For $MgF_2$ at 85° angle of incidence, and a pitch of about 50 nm, the speed is about 2 rpm. Typical rotation speeds used in the process are about 0.2 to 3 rpm.

In FIG. 7A, azimuthal rotation rate of the substrate is plotted against time for the case when the column forms a sinusoidally varying structure as illustrated in FIG. 7C. Times corresponding to points T1–T4 are illustrated on FIG. 7C. During periods of rotation, illustrated by the time segments 52, spinning growth occurs, resulting in the vertical column segments 58 shown in FIG. 7C. The width of the time segments 52 corresponds to the time duration of spinning growth. In between time segments 52, the rotation rate is zero, while the substrate continues to be exposed to vapor flux (paused growth), resulting in the slanted column segments 59. The period between the time segments 52 continually decreases from T1 to T3 and then increases from T3 to T4 in an approximately sinusoidally varying manner. At point T3, time segment 54 corresponds to half a rotation and the pause position switches from the one side to another such that the column begins to grow in a different direction. The half-rotation at T3 corresponds to altering the direction of flux by 180° as illustrated by the arrows C and D in FIG. 7C. In this manner, the column angle $\theta_c$ varies with distance (measured perpendicularly) from the substrate. Column segments deposited at the same time across a substrate form a layer of a thin film.

In FIG. 7B, azimuthal rotation rate is plotted against time for a helical microstructure that falls within the shaded area of the graph of FIG. 2. Each time segment 56 corresponds to a period of rotation. In between the periods of rotation, the substrate rotation is zero (paused) while the substrate continues to be exposed to vapor flux. The time segments 56 and the intervals between them are constant during deposition. In this instance, the time segment 56 corresponds to a rotation of about 360±n°, which results in an offset growth direction for the columns of thin films at an angle that is determined by the azimuthal angle of incidence of the vapor flux. The plus or minus governs the handedness of the helix, and the factor n, which may be for example from 2–10, affects both diameter and pitch of the helical structure. That is, for a given pause/spin relation (say 30% spin and 70% pause as a proportion of time for constant deposition rate), increased precession, ie greater n, will give smaller diameter of the helix and smaller pitch. For a given azimuthal precession of pause position (say 362°), increased pause duration in relation to spin duration, will give larger diameter and smaller pitch. In both cases, the tube diameter of the helix (diameter of the strand forming the helix) should remain fairly constant.

Figure 7E:
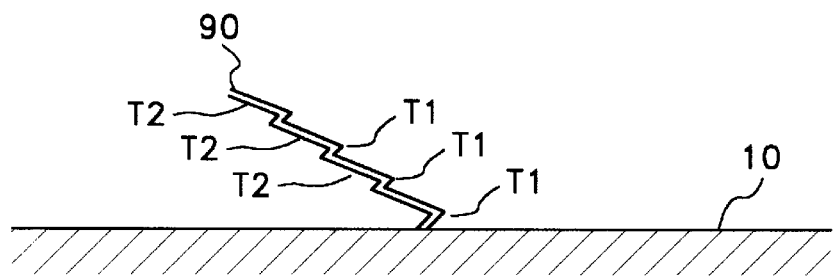
FIG. 7E is a schematic showing columnar growth resulting from the substrate rotation of FIG. 7D.

In FIG. 7D, periods of faster rotation (centered about times T1) for example for one half of a rotation and slower rotation (centered about times T2) for another half a rotation are illustrated. The corresponding columnar growth is shown in FIG. 7E, showing the positions on the column 90 corresponding to the times T1 and T2.

It is believed on reasonable grounds that the process will work with any column forming depositable material. Depositable material is column forming when it exhibits limited adatom diffusion and a sufficiently high sticking factor that structures are formed, rather than unformed masses. In the case of $MgF_2$ thin film formed on a silicon substrate, with S shaped columns, the substrate need not be heated, but the substrate temperature will rise to about 100° C. due to heating from the evaporation source. The diffusion length of the $MgF_2$ under these conditions will be about 40–90 nm. The deposition rate on a monitor near the substrate for flux at normal incidence is about 2–6 nm/s. In this example, fast spinning (spinning growth) occurs at about 3–40 rpm, for a small helical pitch of 10–40 nm. Vacuum pressure for growth in these conditions may be about $1 \times 10^{-6}$ torr.

Figure 13:
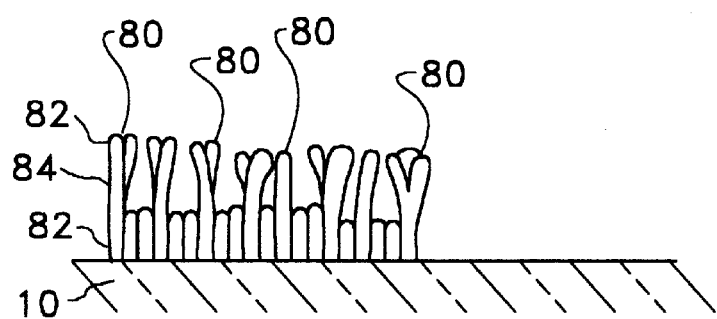
FIG. 13 is a side view of the microstructure of a thin film with varying density.

In the preparation of an interference filter according to the principles of the invention, the thin film depositional apparatus illustrated in FIGS. 9–11A is used together with the principle of spinning growth. Vapor flux from the evaporation source arrives at the substrate at a glancing angle ($\theta_f > 50°$). The substrate position is controlled by the two stepper motors 24 and 26 inside the vacuum deposition system. To generate a film with a density variation with thickness the tilt angle ($\theta_f$) is varied proportionally to the desired density variation during deposition. The axial rotation is rapid during the deposition (spinning growth), generating a vertical porous columnar structure and eliminating the helical columnar structure produced by conventional application of GLAD. This deposition process produces an interference filter with index of refraction that varies according to the distance from the substrate, as illustrated in FIG. 13. In FIG. 13, the columns 80 are grown from a substrate 10 with rapid spinning throughout. As the polar angle $\theta_f$ is varied, the columns 80 produce layers of greater density as shown at 82 and lower density as shown at 84. Layer 82 corresponds to a less oblique incident angle (say 70°) and higher index film, while layer 84 corresponds to a more oblique incident angle (say 85°) and lower index film. The layers thus formed have different densities in adjacent layers. It is believed that by calibrating the density (index) as a function of deposition angle any desired index variation may be generated. The inventors have found that a simple density weighted sum of the index of a thin film material and the index of air was found to predict accurately the effective refractive index as measured with a prism coupler.

Figure 14:
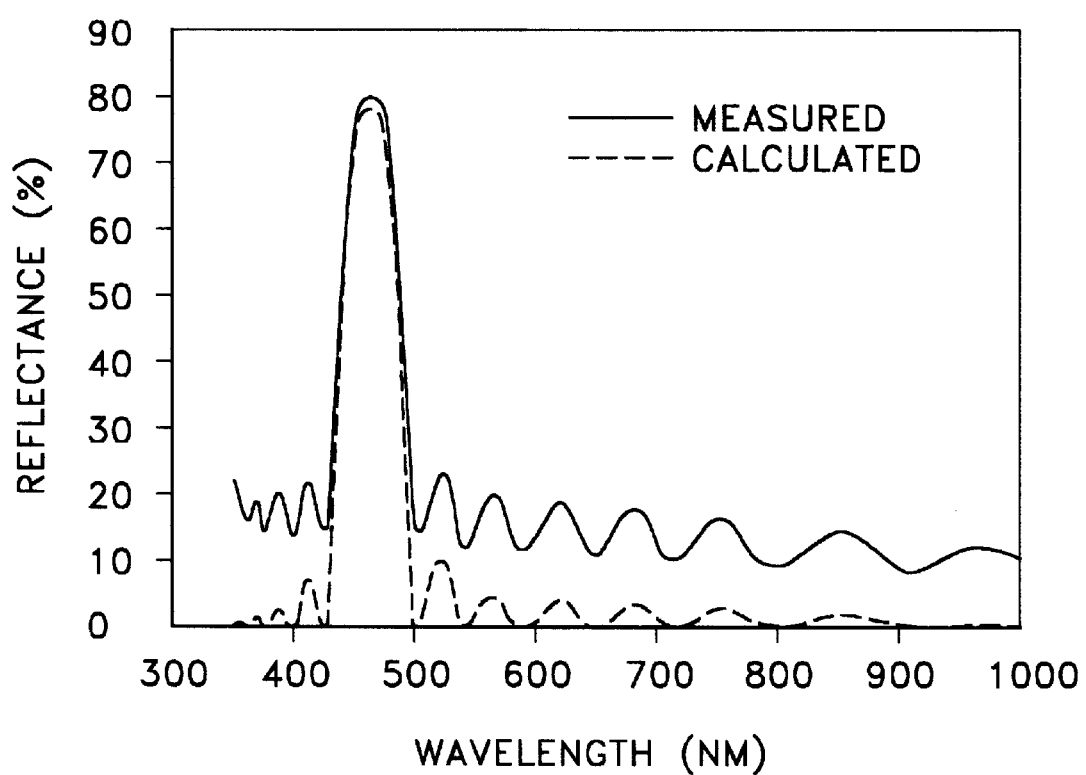
FIG. 14 is a graph showing theoretical and measured spectra of an interference filter with bandwidth 50 nm and reflectance 82%.

As an example, a film with a sinusoidal variation of refractive index, the tilt angle ($\theta_c$) may be varied sinusoidally between 51° and 81° during deposition. The axial rotation is rapid during the deposition, generating a vertical porous columnar structure and eliminating the helical columnar structure produced for other applications of GLAD. This deposition process has been used to produce a $MgF_2$ rugate filter, whose measured and theoretically predicted reflectance spectrum is shown in FIG. 14.

While the deposition angle variation is sinusoidal, the density as a function of oblique deposition angle is nonlinear and it is expected that the density (index) profile is not truly sinusoidal. The inventors estimate that a rugate filter made with $MgF_2$ has a density that varies between approximately 90% and 30% of bulk when deposited at $\theta_c = 51$ and $\theta_c = 81$ degrees respectively. From the index of $MgF_2$ and the index of air a rough estimate of the refractive index range in the film may be obtained as between 1.11 and 1.34 ($n_{avg}=1.22$, $\Delta n=0.23$). The thickness of the film was measured from an SEM to be approximately 2.6 $\mu$m in N=14.5 periods of $\Lambda=180$ nm. This thickness value is large for thermally evaporated $MgF_2$ which typically fractures from stress when deposited thicker than about 1 $\mu$m, lending support to the idea that these films have low stress. Using these measured thicknesses, the theoretical reflection spectrum was calculated using a characteristic matrix method (CMM) implemented in FORTRAN. The measured and theoretical reflection spectra are shown in FIG. 14. Fitting the CMM model to the measured spectrum using the known film thickness and estimates of the density variation, shows that the index variation is between 1.13 to 1.31 ($n_{avg}=1.22$, $\Delta n=0.18$) in good agreement with the estimates from the film density variation. The measured peak reflectance is R=82% and the bandwidth is BW=50 nm centered at about 460 nm. Because the effect of stress is low in these films, the inventors anticipate that very thick filters with correspondingly narrow passbands can be grown. Such filters are of great current interest for wavelength division multiplexing applications in fibre systems.

Figure 12:
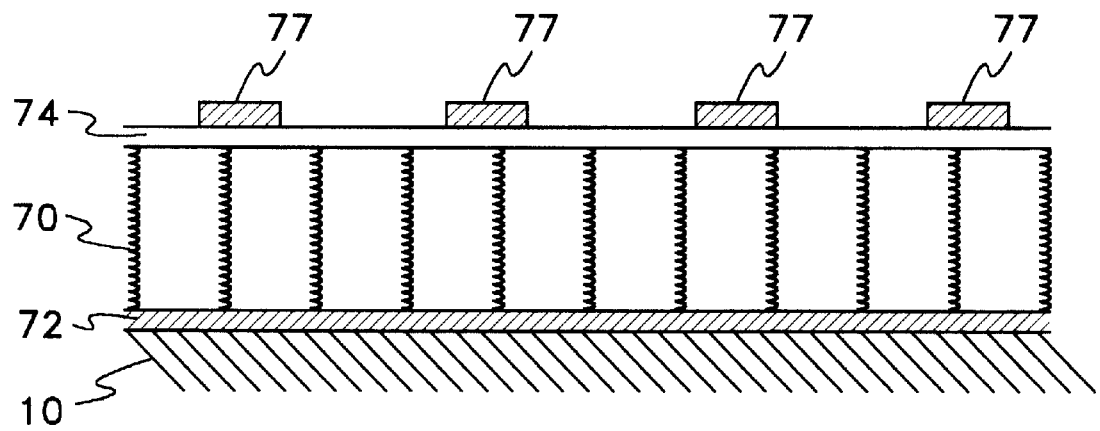
FIG. 12 is a side view of a thin film with helical growths deposited on a substrate with a cap, showing electrodes schematically (the electrodes are not necessarily to scale, since in practice each electrode could cover thousands of helixes)

An optical filter made with a thin film microstructure according to the invention may be tuned using the structure illustrated in FIG. 12. Vapor deposited material extends in distinct (separate from one another) helical columns 70 from an electrode 72 lying on substrate 10. Electrode 72 may also be located on the other side of substrate 10. The distinct helical columns 70 terminating distally from the substrate 10 in a region of denser material forming a cap 74 for the helical columns. The cap 74 may be produced by changing the angle of incidence of the flux from θ near 90° to zero (corresponding to rotation about an axis parallel to the substrate surface), or, it is believed on reasonable grounds that, the deposition of the helical columns may be ended under conditions giving rise to a higher diffusion length, as for example higher substrate temperature or changing to a lower melting point material. Increased substrate temperature may be created by exposing the substrate to light from quartz lamps. Temperatures of within about 100° C. to 200° C. of the melting point of the material being deposited may be required to create conditions of high diffusion length.

As shown in FIG. 12, plural top electrodes 77 may extend in parallel strips across the top of the cap layer 74 or a single electrode may be formed as a single plate on the top of the cap, or the cap may be formed of electrically conducting material to act as an electrode itself. By applying a charge to the electrodes 72 and 77, the electrodes 72 and 77 may be pulled together or pushed apart and thus change the pitch of the helices 70. This has the effect of tuning the filter created by the thin film.

Uses for thin films with helical growths also include applications in semiconductor integrated circuit fabrication such as very low dielectric insulators for high speed devices, optical filters, electrical delay lines, biological filters, electroluminescent devices, catalyst supports, thermal barrier coatings on high temperature cycling parts such as jet turbine blades, flat panel displays, thermoelectric cooling panels, solar absorbers, adhesive surfaces, electron emitters, tactile sensing for smart skins, magnetic devices, anti-reflection/low dielectric constant coatings, humidity sensing and microfluid pumping systems.

When used as helicoidal bianositropic media, the vapor deposited material should be at least partially transparent at the wavelength of the electromagnetic radiation of interest. The invention is believed to be able to make structures with utility for filtering light having optical, infrared, microwave and millimeter wavelength.

In an alternative embodiment, the direction of arrival of the vapor flux at the substrate may be obtained by sequential operation of plural vapor sources disposed about the substrate. For this operation, it is convenient to use sputtering devices for the vapor sources. The vapor sources may be located around a hemi-spherical enclosure disposed above a substrate. For example, there may be a single source at the apex of the enclosure, with several, eg four, sources disposed in each of several layers or rings of sources disposed further outward and downward from the apex. Sources in adjacent layers may be offset from each other. The sources may then be operated (turned on and off) sequentially to cause the vapor to arrive at different directions of arrival. The direction of arrival of the vapor flux at the substrate may be rotated in this fashion about a normal to the substrate or the angle of incidence may be changed. Other ways of accomplishing the variation in direction of arrival of the vapor flux at the substrate in accordance with the principles of the invention may occur to a person skilled in the art and these are intended to be covered by the claims that follow.

A person skilled in the art could make immaterial modifications to the invention described in this patent document without departing from the essence of the invention that is intended to be covered by the scope of the claims that follow.

The embodiments of the invention in which an exclusive property or privilege is claimed are defined as follows:

1. A method of growing vapor deposited thin films, the method comprising the steps of:
   A) initially exposing a surface of a substrate to a vapor flux under a given set of growth conditions at an oblique incident angle while rotating the direction of arrival of the vapor flux at the substrate at a rotation speed about a normal to the substrate to grow a first portion of a thin film formed of a plurality of columns growing in a first growth direction;
   B) subsequently, and while exposing the surface to vapor flux, altering the set of growth conditions to cause a second portion of each of the plurality of columns to grow in a growth direction offset from the first growth direction; and
   C) repeating steps A and B to create a first thin film formed of columns on the substrate.

2. The method of claim 1 in which altering the set of growth conditions comprises changing the rotation speed of the direction of arrival of the vapor flux at the substrate.

3. The method of claim 2 in which altering the set of growth conditions comprises reducing the rotation speed of the direction of arrival of the vapor flux at the substrate.

4. Tile method of claim 2 in which, in each repetition of step A, the direction of arrival of the vapor flux at the substrate is rotated an integral number of times.

5. The method of claim 2 in which, in each step B except an initial step B, the growth direction is offset from the growth direction in the preceding step B.

6. The method of claim 2 in which, in each step A, the first growth direction is perpendicular to the surface of the substrate.

7. The method of claim 6 in which, in each step B except an initial step B, the growth direction is offset from the growth direction in the preceding step B.

8. The method of claim 2 in which the first thin film formed by repetition of steps A and B has a first porosity, and the method further comprises:
   repeating steps A and B under different growing conditions to grow a second thin film on the first thin film wherein the second thin film has a second porosity different from the first porosity.

9. The method of claim 8 further comprising forming an optical filter with plural thin film layers, wherein each thin film layer is formed by repeating steps A and B.

10. The method of claim 2 in which the rotation speed of the direction of arrival of the vapor flux at the substrate during step A is sufficiently high that the direction of arrival of the vapor flux at the substrate rotates at least once within the time required for the thin film to grow a distance, measured normal to the substrate, substantially equal to the adatom diffusion length of the material being deposited.

11. The method of claim 2 in which a thin film with graded density is made by repeating steps A and B under varying growing conditions.

12. The method of claim 1 in which the substrate is rotated.

13. A method of growing vapor deposited thin films, the method comprising the steps of:
   exposing a surface of a substrate to a vapor flux at an oblique incident angle greater than 70° while rotating the direction of arrival of the vapor flux at the substrate at a rotation speed about a normal to the substrate to grow a thin film formed of a plurality of columns growing in a first growth direction; and
   the rotation speed being sufficiently high that the direction of arrival of the vapor flux at the substrate rotates at least once within the time required for the thin film to grow a distance, measured normal to the substrate, substantially equal to the adatom diffusion length of the material being deposited.

14. The method of claim 13 further comprising:
   while rotating the direction of arrival of the vapor flux at the substrate, varying the oblique incident angle of the vapor flux to vary the density and hence refractive index of the thin film.

15. The method of claim 14 in which the oblique incident angle of vapor flux is varied to produce alternating bands of high and low density material deposited on the substrate.

16. A method of filtering electromagnetic radiation, wherein the electromagnetic radiation includes radiation having a frequency $\lambda$ and the electromagnetic radiation is propagating along a light path, the method comprising the steps of:
   placing an optical filter in the light path, wherein the optical filter comprises plural helical columns extending from a substrate, the helical columns each having a pitch p sufficiently smaller than $\lambda$ that propagation of light is unaffected by the helical structure of the columns.

17. The method of claim 16 in which $p<\lambda/4$.

18. The method of claim 17 in which $p<\lambda/10$.

* * * * *